(12) United States Patent
Lee et al.

(10) Patent No.: US 9,029,872 B2
(45) Date of Patent: May 12, 2015

(54) SEMICONDUCTOR DEVICE AND METHOD FOR FABRICATING THE SAME

(71) Applicant: Hyundai Motor Company, Seoul (KR)

(72) Inventors: Jong Seok Lee, Suwon-si (KR); Kyoung-Kook Hong, Hwaseong-si (KR); Dae Hwan Chun, Gwangmyung-si (KR); Youngkyun Jung, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/098,409

(22) Filed: Dec. 5, 2013

(65) Prior Publication Data

US 2014/0183559 A1    Jul. 3, 2014

(30) Foreign Application Priority Data

Dec. 27, 2012    (KR) .................. 10-2012-0155374

(51) Int. Cl.
| | | |
|---|---|---|
| *H01L 21/00* | (2006.01) | |
| *H01L 29/16* | (2006.01) | |
| *H01L 29/66* | (2006.01) | |
| *H01L 29/78* | (2006.01) | |
| *H01L 29/06* | (2006.01) | |
| *H01L 21/04* | (2006.01) | |
| *H01L 29/417* | (2006.01) | |

(52) U.S. Cl.
CPC ...... *H01L 29/1608* (2013.01); *H01L 29/66068* (2013.01); *H01L 29/41766* (2013.01); *H01L 29/7813* (2013.01); *H01L 29/0623* (2013.01); *H01L 21/0455* (2013.01)

(58) Field of Classification Search
CPC ............ H01L 29/7827; H01L 29/1037; H01L 29/66666; H01L 29/1608; H01L 21/0455; H01L 29/7813; H01L 29/0623; H01L 29/66068; H01L 29/41766
USPC .............................. 257/77, 330; 438/270, 268
See application file for complete search history.

(56) References Cited

U.S. PATENT DOCUMENTS

| | | | |
|---|---|---|---|
| 6,410,958 B1 * | 6/2002 | Usui et al. ............ | 257/329 |
| 6,740,931 B2 * | 5/2004 | Kouzuki et al. ............ | 257/341 |
| 7,224,022 B2 * | 5/2007 | Tokano et al. ............ | 257/328 |
| 7,723,783 B2 * | 5/2010 | Saito et al. ............ | 257/330 |
| 8,049,270 B2 | 11/2011 | Akiyama et al. | |
| 8,390,060 B2 * | 3/2013 | Darwish et al. ............ | 257/330 |
| 8,586,434 B1 * | 11/2013 | Jung et al. ............ | 438/268 |
| 8,772,112 B1 * | 7/2014 | Chun et al. ............ | 438/270 |
| 8,829,608 B2 * | 9/2014 | Saito et al. ............ | 257/331 |
| 2002/0063259 A1 * | 5/2002 | Usui et al. ............ | 257/110 |
| 2004/0012038 A1 * | 1/2004 | Kouzuki et al. ............ | 257/200 |
| 2006/0138536 A1 * | 6/2006 | Kouzuki et al. ............ | 257/341 |

(Continued)

FOREIGN PATENT DOCUMENTS

| | | | |
|---|---|---|---|
| JP | 2001-144292 A | 5/2001 | |
| JP | 2008-108962 A | 5/2008 | |

*Primary Examiner* — Laura Menz
(74) *Attorney, Agent, or Firm* — McDermott Will & Emery LLP (57) ABSTRACT

The present inventive concept has been made in an effort to improve the breakdown voltage of a silicon carbide MOSFET using a trench gate.

A semiconductor device according to the present inventive concept includes a p type pillar region disposed below the trench, spaced apart from the trench or a first p type pillar region and a second p type pillar region disposed below the trench and corresponding to two corners of the trench.

3 Claims, 9 Drawing Sheets

(56) References Cited

U.S. PATENT DOCUMENTS

| | | | |
|---|---|---|---|
| 2006/0216896 A1* | 9/2006 | Saito et al. | 438/270 |
| 2007/0018243 A1* | 1/2007 | Ono et al. | 257/330 |
| 2007/0114602 A1* | 5/2007 | Saito et al. | 257/330 |
| 2008/0017897 A1* | 1/2008 | Saito et al. | 257/288 |
| 2010/0308399 A1* | 12/2010 | Saito et al. | 257/329 |
| 2012/0012929 A1* | 1/2012 | Saito et al. | 257/335 |
| 2012/0098055 A1* | 4/2012 | Darwish et al. | 257/330 |
| 2014/0054684 A1* | 2/2014 | Darwish et al. | 257/330 |
| 2014/0077225 A1* | 3/2014 | Lee et al. | 257/77 |
| 2014/0097447 A1* | 4/2014 | Lee et al. | 257/77 |
| 2014/0117379 A1* | 5/2014 | Jung et al. | 257/77 |
| 2014/0167071 A1* | 6/2014 | Lee et al. | 257/77 |
| 2014/0167072 A1* | 6/2014 | Chun et al. | 257/77 |
| 2014/0170824 A1* | 6/2014 | Jung et al. | 438/270 |
| 2014/0183556 A1* | 7/2014 | Lee et al. | 257/77 |
| 2014/0183558 A1* | 7/2014 | Lee et al. | 257/77 |
| 2014/0183559 A1* | 7/2014 | Lee et al. | 257/77 |
| 2014/0183560 A1* | 7/2014 | Lee et al. | 257/77 |
| 2014/0187004 A1* | 7/2014 | Chun et al. | 438/270 |
| 2014/0264562 A1* | 9/2014 | Cheng et al. | 257/330 |
| 2014/0264563 A1* | 9/2014 | Cheng et al. | 257/330 |

* cited by examiner

SEMICONDUCTOR DEVICE AND METHOD FOR FABRICATING THE SAME

CROSS-REFERENCE TO RELATED APPLICATION

This application claims benefit of priority to Korean Patent Application No. 10-2012-0155374 filed in the Korean Intellectual Property Office on Dec. 27, 2012, the entire contents of which are incorporated herein by reference.

TECHNICAL FIELD

The present inventive concept relates to a semiconductor device including silicon carbide (SiC) and a method for fabricating the same.

BACKGROUND

With the recent trend toward large-sized and large-capacity application apparatuses, a power semiconductor device having a high breakdown voltage, a high current capacity, and high-speed switching characteristics has become necessary.

Accordingly, many researches and developments are being conducted on MOSFETs (metal oxide semiconductor field effect transistors) using silicon carbide (SiC), instead of conventional MOSFETs using silicon. Particularly, there is a lot of development of vertical trench MOSFETs.

In the case of a vertical trench MOSFET, a breakdown occurs which can damage an oxide film due to an electric field concentration effect by which an electric field is concentrated at the bottom of a gate. This causes a premature breakdown which exhibits a breakdown voltage much lower than a breakdown voltage caused by the intrinsic threshold voltage of a raw material of the MOSFET.

The above information disclosed in this Background section is only for enhancement of understanding of the background of the inventive concept and therefore it may contain information that does not form the prior art.

SUMMARY

The present inventive concept has been made in an effort to improve the breakdown voltage of a silicon carbide MOSFET using a trench gate.

An aspect of the present inventive concept relates to a semiconductor device including: an n+ type silicon carbide substrate; a first p type pillar region and an n- type epitaxial layer disposed on a first surface of the n+ type silicon carbide substrate; a p type epitaxial layer and an n+ region sequentially disposed on the n- type epitaxial layer; a trench penetrating the n+ region and the p type epitaxial layer and disposed on the n- type epitaxial layer; a gate insulating film disposed within the trench; a gate electrode disposed on the gate insulating film; an oxide film disposed on the gate electrode; a source electrode disposed on the p type epitaxial layer, the n+ region, and the oxide film; and a drain electrode positioned on a second surface of the n+ type silicon carbide substrate, wherein the first p type pillar region is disposed within the n- type epitaxial layer, and the first p type pillar region is disposed below the trench, spaced apart from the trench.

The first type pillar region may be disposed in an area corresponding to a portion between two corners of the trench.

The semiconductor according to the present inventive concept may further include a second p type pillar region that is disposed on the first surface of the n+ type silicon carbide substrate and spaced apart from the first p type pillar region.

The second p type pillar region may be spaced apart from the trench, and disposed within the n- type epitaxial layer.

The first p type pillar region and the second p type pillar region may be respectively disposed in areas corresponding to two corners of the trench.

The first p type pillar region and the second p type pillar region may have the same width and length.

Another aspect of the present inventive concept encompasses a method for fabricating a semiconductor device, the method including: forming a buffer layer pattern on a first surface of an n+ type silicon carbide substrate to expose a part of the first surface of the n+ type silicon carbide substrate; forming a first p type pillar region by first epitaxial growth on the exposed part of the first surface of the n+ type silicon carbide substrate; removing the buffer layer pattern, and then forming an n- type epitaxial layer by second epitaxial growth on the first p type pillar region and the first surface of the n+ type silicon carbide substrate; forming a p type epitaxial layer by third epitaxial growth on the n- type epitaxial layer; forming an n+ region by fourth epitaxial growth on the p type epitaxial layer; and forming a trench by penetrating the n+ region and the p type epitaxial layer and etching and the n- type epitaxial layer, wherein the first p type pillar region is formed below the trench, and spaced apart from the trench.

The first type pillar region may be disposed in an area corresponding to a portion between two corners of the trench.

The forming of a first p type pillar region may further include forming a second p type pillar region on the first surface of the n+ type silicon carbide substrate, the first p type pillar region being spaced apart from the first p type pillar region, and positioned within the n- type epitaxial layer.

The first p type pillar region and the second p type pillar region may have the same width and length, and the first p type pillar region and the second p type pillar region may be respectively formed in areas corresponding to two corners of the trench.

The method for fabricating a semiconductor device according to the exemplary embodiment of the present inventive concept may further include: after the forming of an n+ region, forming a gate insulating film within the trench; forming a gate electrode on the gate insulating film; forming an oxide film on the gate insulating film and the gate electrode; and forming a source electrode on the p type epitaxial layer, the n+ region, and the oxide film and forming a drain electrode on the second surface of the n+ type silicon carbide substrate.

According to an exemplary embodiment of the present inventive concept, a p type pillar region is disposed in an area provided below the trench and corresponding to a portion between two corners of the trench, or two p type pillar regions are disposed in areas provided below the trench and corresponding to two corners of the trench. As a result, an electric field concentrated on the gate insulating film at the bottom of the trench spreads to a junction between the p type pillar region and the n- type epitaxial layer.

Accordingly, the breakdown voltage of the semiconductor device can be improved.

BRIEF DESCRIPTION OF THE DRAWINGS

The foregoing and other features of the inventive concept will be apparent from a more particular description of embodiments of the inventive concept, as illustrated in the accompanying drawings in which like reference characters may refer to the same or similar parts throughout the different views. The drawings are not necessarily to scale, emphasis instead being placed upon illustrating the principles of the embodiments of the inventive concept.

DETAILED DESCRIPTION

Exemplary embodiments of the present inventive concept will be described in detail with reference to the attached drawings. The present inventive concept may be modified in many different forms and should not be construed as being limited to the exemplary embodiments set forth herein. Rather, the exemplary embodiments of the present inventive concept are provided so that this disclosure will be thorough and complete, and will fully convey the concept of the present inventive concept to those skilled in the art.

In the drawings, the thickness of layers and regions may be exaggerated for clarity. In addition, when a layer is described to be formed on another layer or on a substrate, this means that the layer may be formed on the other layer or on the substrate, or a third layer may be interposed between the layer and the other layer or the substrate. Like numbers refer to like elements throughout the specification.

Figure 1:
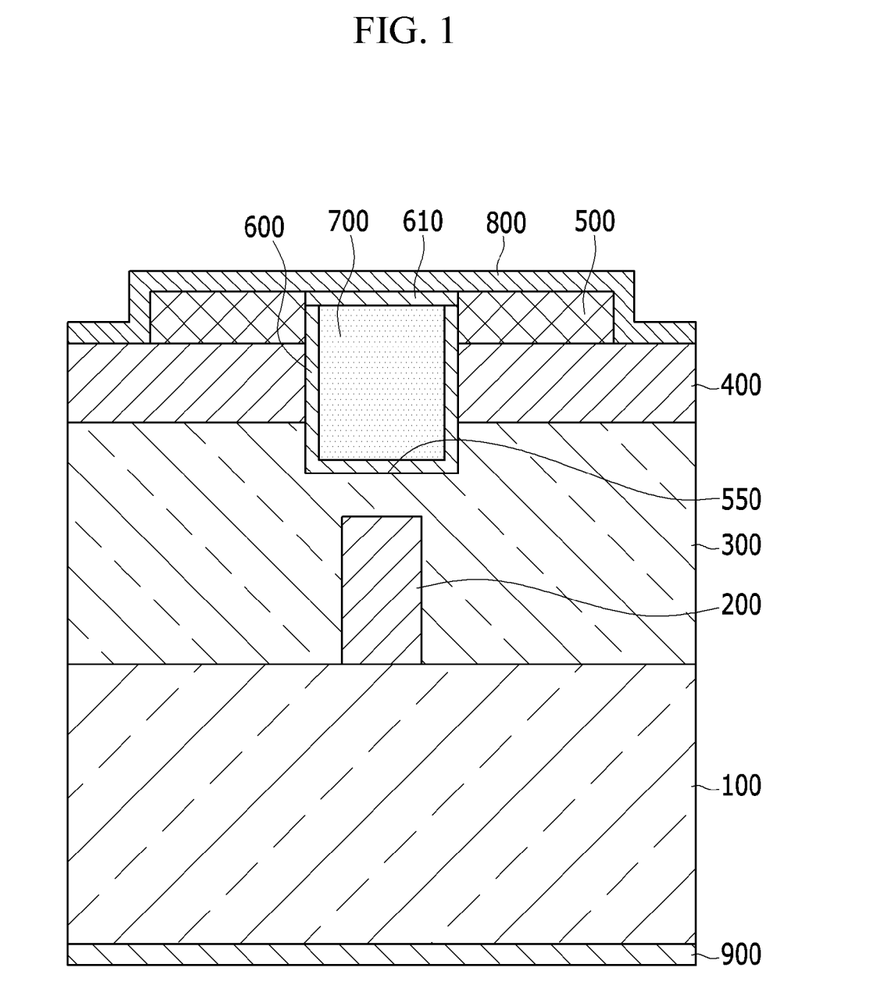
FIG. 1 is a cross-sectional view of a semiconductor device according to an exemplary embodiment of the present inventive concept.

FIG. 1 is a cross-sectional view of a semiconductor device according to an exemplary embodiment of the present inventive concept.

Referring to FIG. 1, the semiconductor device according to an exemplary embodiment of the present inventive concept may have a p type pillar region 200 and an n− type epitaxial layer 300 disposed on a first surface of an n+ type silicon carbide substrate 100. The p type pillar region 200 may be disposed within the n− type epitaxial layer 300.

A p type epitaxial layer 400 and an n+ region 500 may be sequentially disposed on the n− type epitaxial layer 300.

A trench 550 may be disposed in the n− type epitaxial layer 300, the p type epitaxial layer 400, and the n+ region 500. The trench 550 may penetrate the n+ region 500 and the p type epitaxial layer 400.

The p type pillar region 200 may be spaced apart from the trench 550, and disposed in an area provided below the trench 550 and corresponding to a portion between two corners of the trench 550.

A gate insulating film 600 may be disposed within the trench 550, a gate electrode 700 may be disposed on the gate insulating film 600, and an oxide film 610 may be disposed on the gate insulating film 600 and the gate electrode 700. The gate electrode 700 may fill the trench 550.

A source electrode 800 may be formed on the p type epitaxial layer 400, the n+ region 500, and the oxide film 610. A drain electrode 900 may be formed on a second surface of the n+ type silicon carbide substrate 100.

As the p type pillar region 200 may be disposed in an area provided below the trench 550 and corresponding to a portion between two corners of the trench 550, an electric field concentrated on the gate insulating film 600 may spread by a junction between the p type pillar region 200 and the n− type epitaxial layer 300. As a result, the breakdown voltage can be improved.

Now, a method for fabricating a semiconductor device according to one exemplary embodiment of the present inventive concept will be described with reference to FIGS. 2 to 7 and FIG. 1.

FIG. 2 to FIG. 7 are views sequentially showing a method for fabricating a semiconductor device according to an exemplary embodiment of the present inventive concept.

Figure 2:
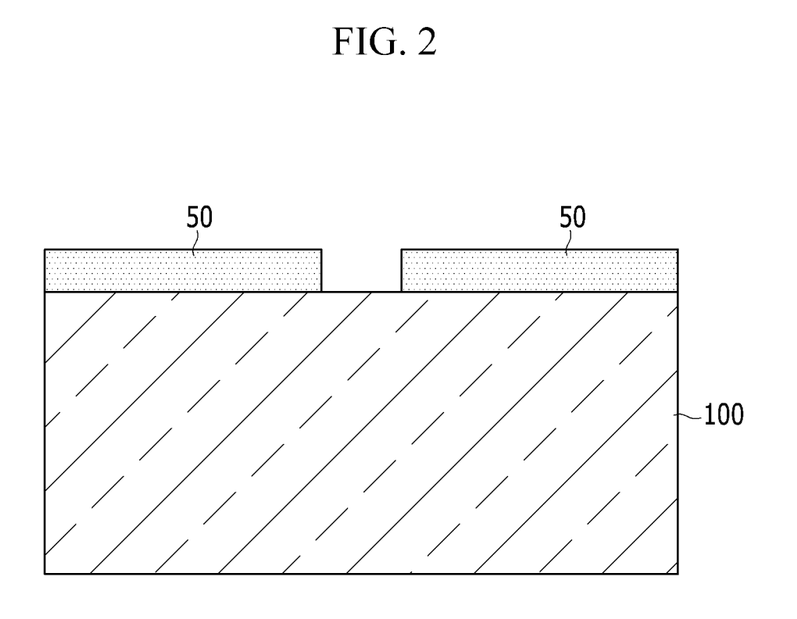
FIG. 2 to FIG. 7 are views sequentially showing a method for fabricating a semiconductor device according to an exemplary embodiment of the present inventive concept.

As shown in FIG. 2, an n+ type silicon carbide substrate 100 may be prepared, and a buffer layer pattern 50 may be formed on a first surface of the n+ type silicon carbide substrate 100. The buffer layer pattern 50 may expose a part of the first surface of the n+ type silicon carbide substrate 100.

Figure 3:
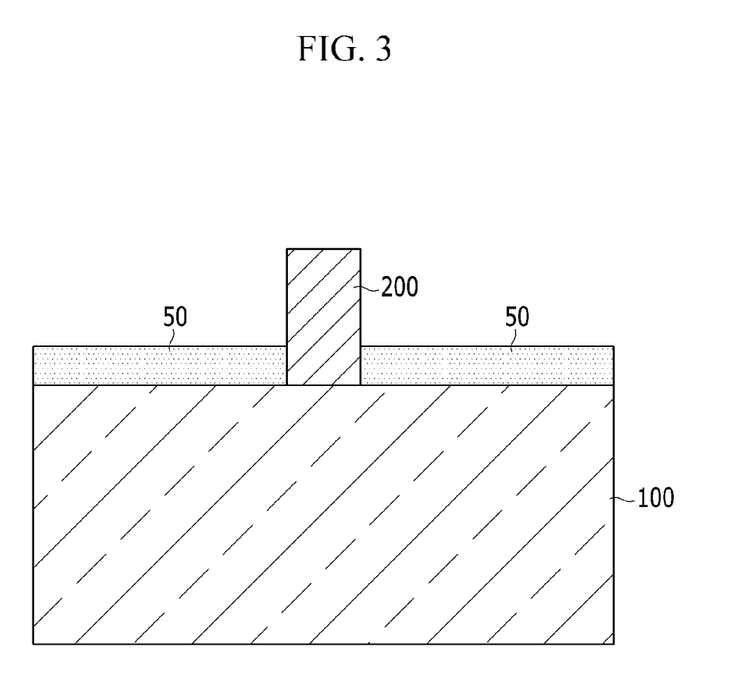

As shown in FIG. 3, a plurality of p type pillar regions 200 may be formed by first epitaxial growth on the exposed part of the first surface of the n+ type silicon carbide substrate 100.

Figure 4:
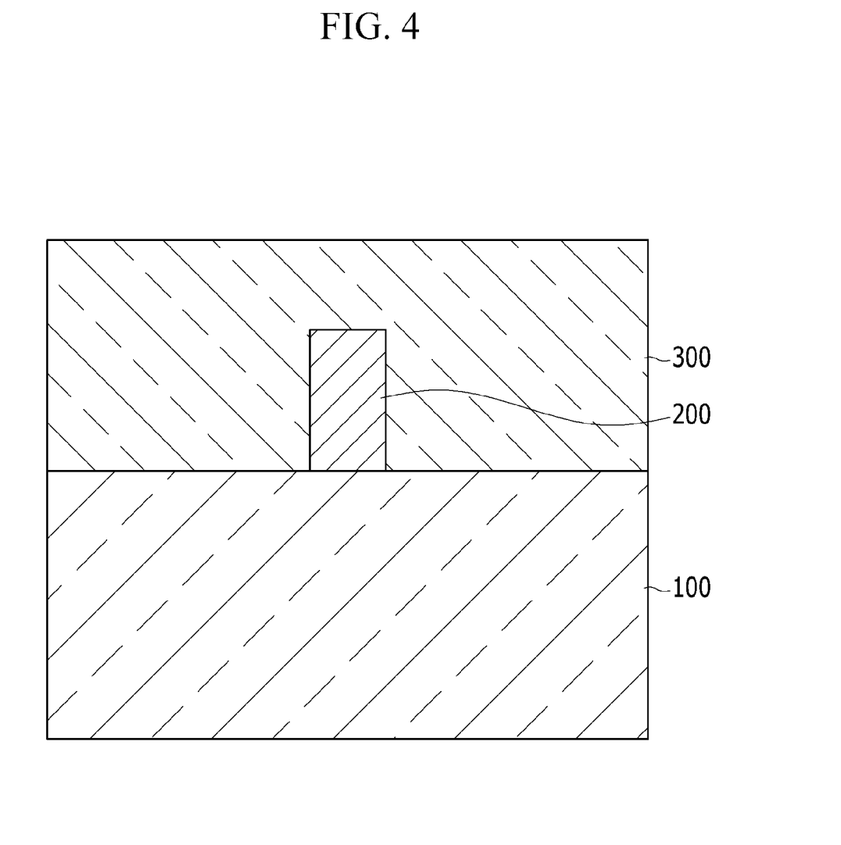

As shown in FIG. 4, the buffer layer pattern 50 may be removed, and then an n− type epitaxial layer 300 may be formed by second epitaxial growth on the p type pillar region 200 and the first surface of the n+ type silicon carbide substrate 100.

Figure 5:
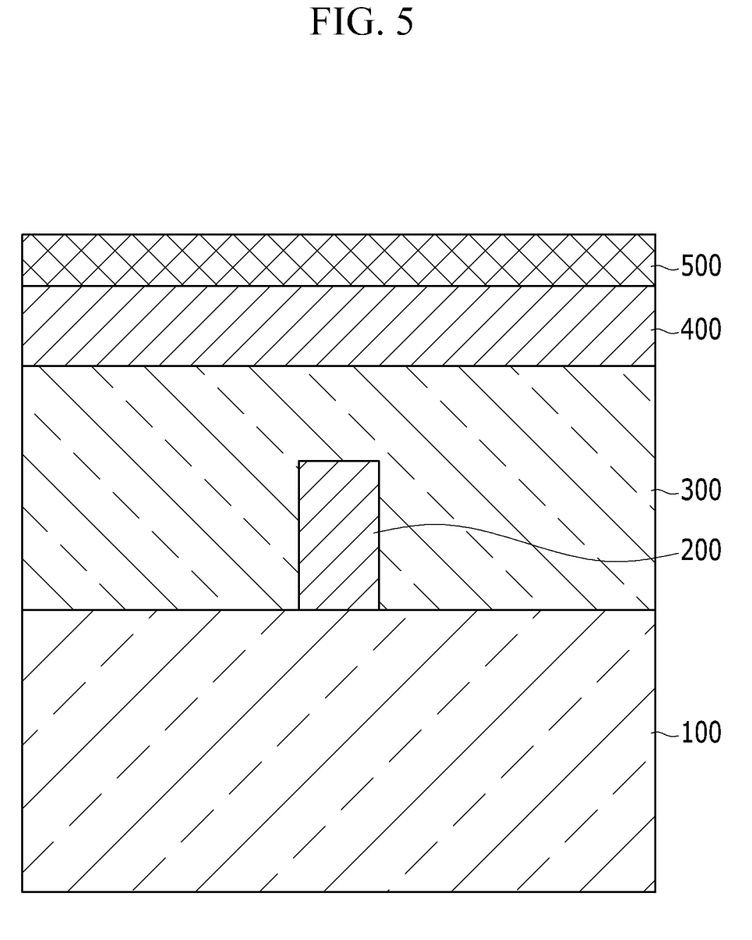

As shown in FIG. 5, a p type epitaxial layer 400 may be formed by third epitaxial growth on the n− type epitaxial layer 300, and then an n+ region 500 may be formed by fourth epitaxial growth on the p type epitaxial layer 400.

The n+ region 500 may be formed by the fourth epitaxial growth in an exemplary embodiment of the present inventive concept. Alternatively, the n+ region 500 may be formed by implanting n+ ions into part of the surface of the p type epitaxial layer 400, without performing epitaxial growth.

Figure 6:
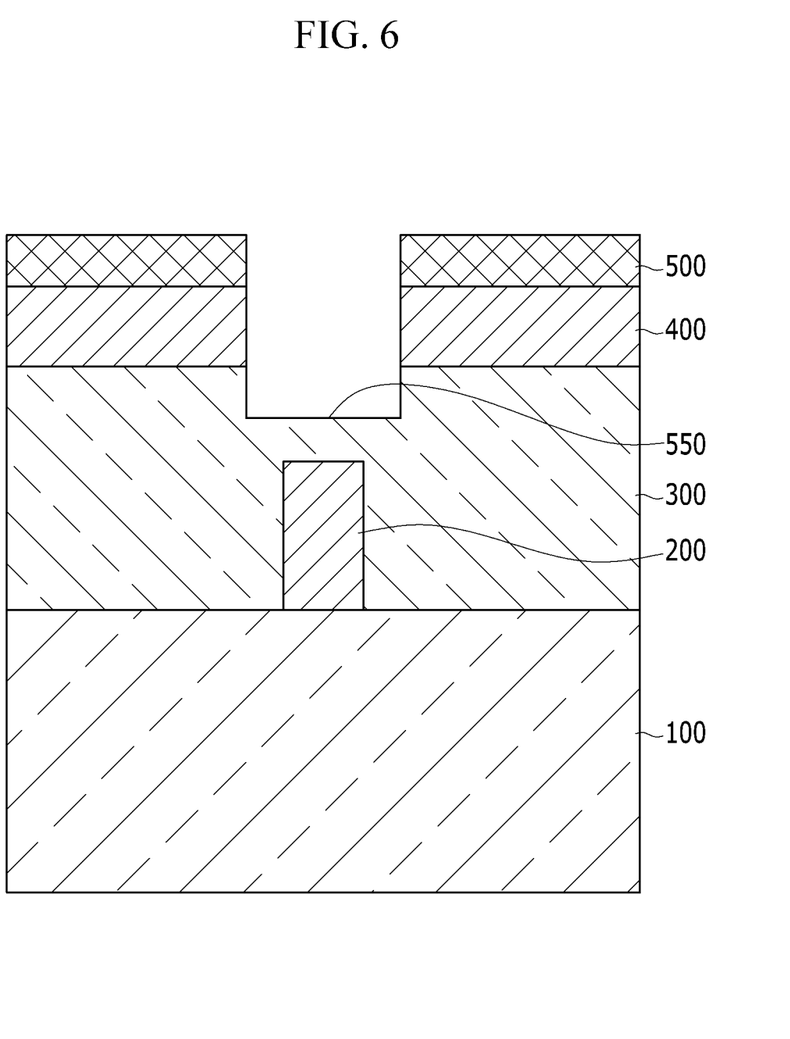

As shown in FIG. 6, a trench 550 may be formed by etching a part of the n+ region 500, the p type epitaxial layer 400, and the n− type epitaxial layer 300. The trench 550 may penetrate the n+ region 500 and the p type epitaxial layer 400. The p type pillar region 200 may be positioned below the trench 550, spaced apart from the trench 550. Also, the p type pillar region 200 may be positioned in an area corresponding to a portion between two corners of the trench 550.

Figure 7:
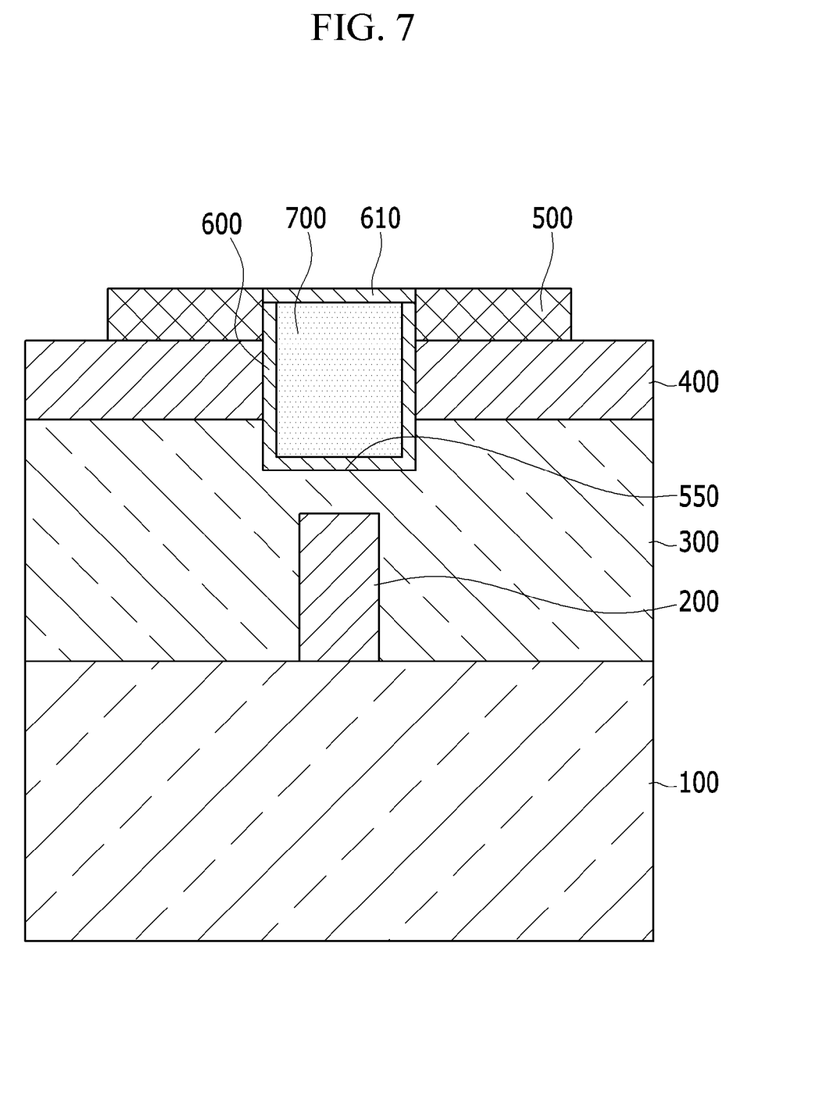

As shown in FIG. 7, a gate insulating film 600 may be formed within the trench 550, and a gate electrode 700 may be formed on the gate insulating film 600. An oxide film 610 may be formed on the gate insulating film 600 and the gate electrode 700, and part of the n+ region 500 is etched.

As shown in FIG. 1, a source electrode 800 may be formed on the p type epitaxial layer 400, the n+ region 500, and the oxide film 610, and a drain electrode 850 is formed on a second surface of the n+ type silicon carbide substrate 100.

Now, the characteristics of a semiconductor according to an exemplary embodiment of the present inventive concept and of a conventional semiconductor device will be described in detail with reference to FIG. 8.

Figure 8:
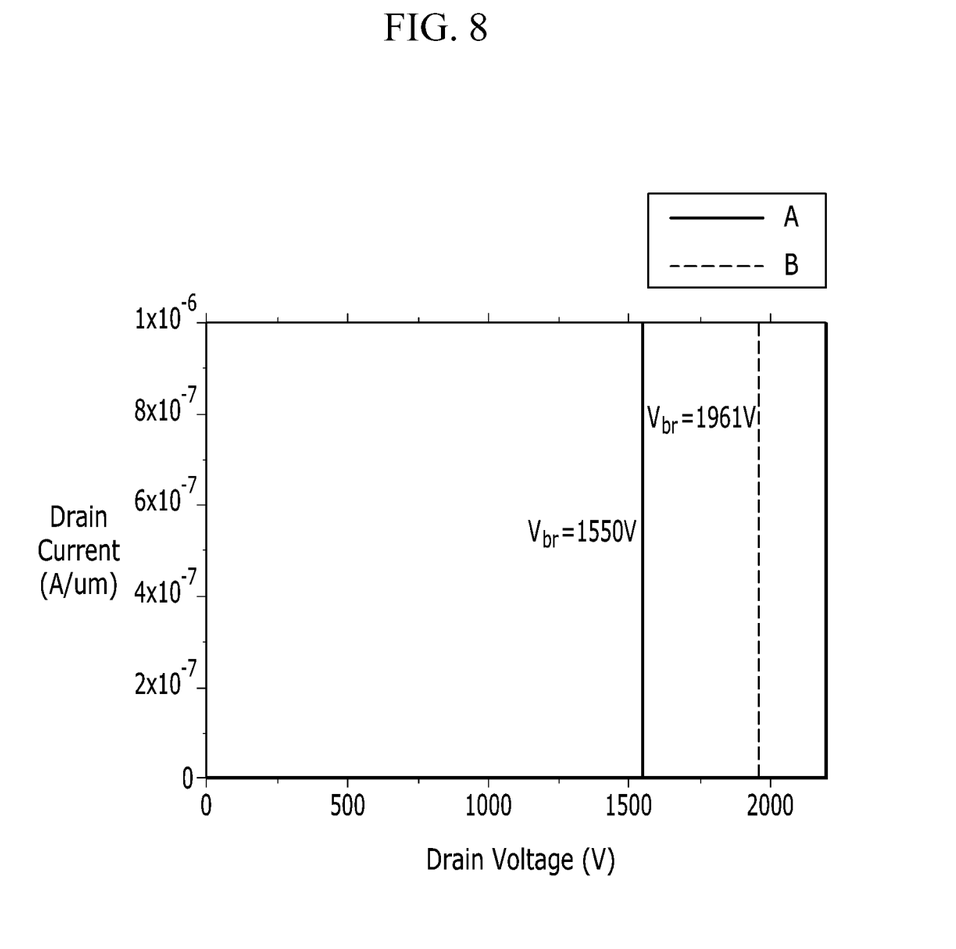
FIG. 8 is a graph comparing the breakdown voltage of a semiconductor device according to an exemplary embodiment of the present inventive concept with the breakdown voltage of a conventional semiconductor device.

FIG. 8 is a graph comparing the breakdown voltage of a semiconductor device according to an exemplary embodiment of the present inventive concept with the breakdown voltage of a conventional semiconductor device.

In FIG. 8, A represents a typical vertical trench MOSFET according to the conventional art, i.e., a vertical trench MOSFET having no p type pillar region disposed below the trench, and B represents a semiconductor device according to an exemplary embodiment of the present inventive concept.

Referring to FIG. 8, the breakdown voltage of the typical vertical trench MOSFET according to the conventional art was 1550 V, and the breakdown voltage of the semiconductor device according to one exemplary embodiment of the present inventive concept was 1961 V.

Based upon this, it can be concluded that the breakdown voltage of the semiconductor device according to an exemplary embodiment of the present inventive concept was compared with the breakdown voltage of the conventional semiconductor device. The result shows that the breakdown voltage of the semiconductor device according to an exemplary embodiment of the present inventive concept was about 27% higher than the breakdown voltage of the typical vertical trench MOSFET according to the conventional art. This means that the breakdown voltage of the semiconductor device according to an exemplary embodiment of the present inventive concept was improved, compared with the breakdown voltage of the typical semiconductor device according to the conventional art.

Now, a semiconductor device according to another exemplary embodiment of the present inventive concept will be described with reference to FIG. 9.

Figure 9:
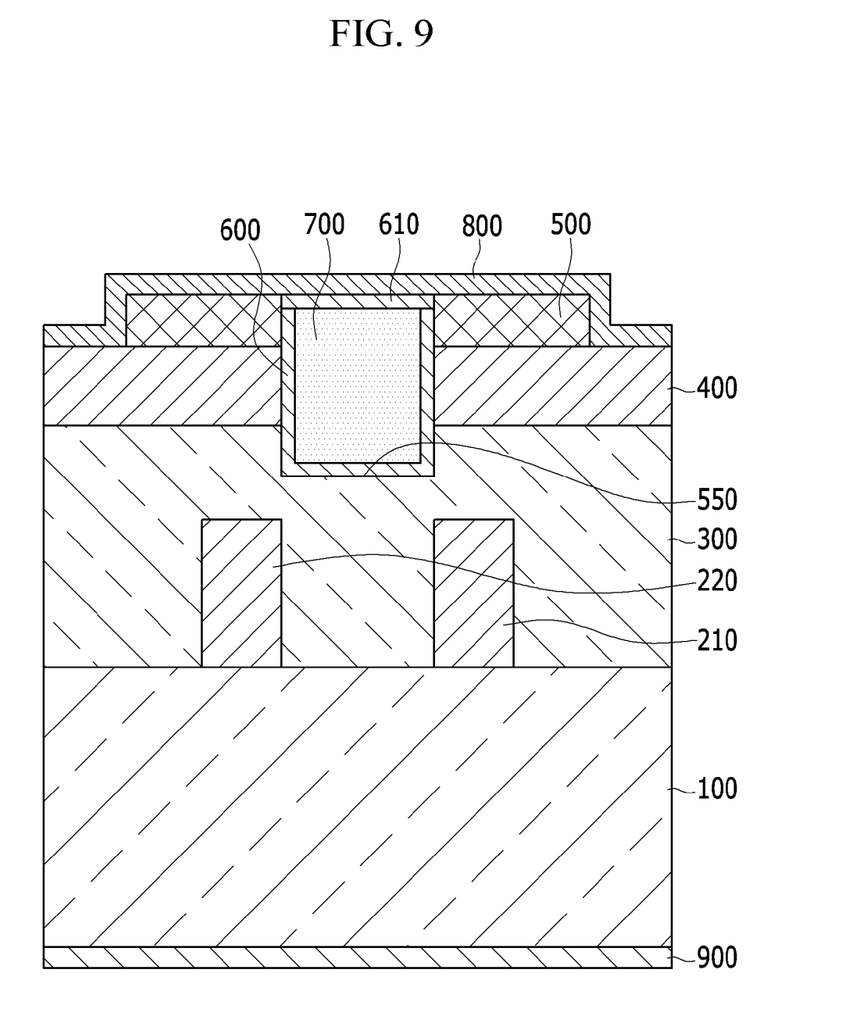
FIG. 9 is a cross-sectional view of a semiconductor device according to another exemplary embodiment of the present inventive concept.

FIG. 9 is a cross-sectional view of a semiconductor device according to another exemplary embodiment of the present inventive concept.

Referring to FIG. 9, the semiconductor device according to an exemplary embodiment of the present inventive concept is identical to the semiconductor device of FIG. 1, except that a first p type pillar region 210 and a second p type pillar region 220 may be disposed on a first surface of an n+ type silicon carbide substrate 100.

In the semiconductor device according to an exemplary embodiment of the present inventive concept, a first p type pillar region 210, a second p type pillar region 220, and an n− type epitaxial layer 300 may be disposed on a first surface of an n+ type silicon carbide substrate 100. The first p type pillar region 210 and the second p type pillar region 220 may be spaced apart from each other, and disposed within the n− type epitaxial layer 300. The first p type pillar region 210 and the second p type pillar region 200 may have the same width and length. Moreover, the first p type pillar region 210 and the second p type pillar region 220 may be simultaneously formed during the same epitaxial growth.

A p type epitaxial layer 400 and an n+ region 500 may be sequentially disposed on the n− type epitaxial layer 300.

A trench 550 may be disposed in the n− type epitaxial layer 300, the p type epitaxial layer 400, and the n+ region 500. The trench 550 may penetrate the n+ region 500 and the p type epitaxial layer 400.

The first p type pillar region 210 and the second p type pillar region 220 may be spaced apart from the trench 550, and disposed in areas provided below the trench 550 and corresponding to two corners of the trench 550.

A gate insulating film 600 may be disposed within the trench 550, a gate electrode 700 may be disposed on the gate insulating film 600, and an oxide film 610 may be disposed on the gate insulating film 600 and the gate electrode 700. The gate electrode 700 may fill the 550.

A source electrode 800 may be formed on the p type epitaxial layer 400, the n+ region 500, and the oxide film 610. A drain electrode 900 may be formed on a second surface of the n+ type silicon carbide substrate 100.

As the first p type pillar region 210 and the second p type pillar region 220 may be disposed in areas provided below the trench 550 and corresponding to two corners of the trench 550, an electric field concentrated on the gate insulating film 600 at the bottom of the trench 550 may spread by a junction between the first and second p type pillar regions 210 and 220 and the n− type epitaxial layer 300. As a result, the breakdown voltage can be improved.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

DESCRIPTION OF SYMBOLS

| | |
|---|---|
| 50: buffer layer pattern | |
| 100: n+ type silicon carbide substrate | |
| 200: p type pillar region | 210: first p type pillar region |
| 220: second p type pillar region | 300: n− type epitaxial layer |
| 400: p type epitaxial layer | 500: n+ region |
| 550: trench | 600: gate insulating film |
| 610: oxide film | 700: gate electrode |
| 800: source electrode | 900: drain electrode |

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A semiconductor device, comprising:
    an n+ type silicon carbide substrate;
    a first p type pillar region and an n− type epitaxial layer, disposed on a first surface of the n+ type silicon carbide substrate;
    a p type epitaxial layer and an n+ region, sequentially disposed on the n− type epitaxial layer;
    a trench penetrating the n+ region and the p type epitaxial layer and disposed on the n− type epitaxial layer;
    a gate insulating film disposed within the trench;
    a gate electrode disposed on the gate insulating film;
    an oxide film disposed on the gate electrode;
    a source electrode disposed on the p type epitaxial layer, the n+ region, and the oxide film; and
    a drain electrode positioned on a second surface of the n+ type silicon carbide substrate, wherein:
    the first p type pillar region is disposed within the n− type layer and spaced apart from the trench, and
    the first p type pillar region is disposed in an area corresponding to a portion between two corners of the trench and in an area corresponding to the bottom of the trench.

2. A method for fabricating a semiconductor device, the method comprising:
    forming a buffer layer pattern on a first surface of an n+ type silicon carbide substrate to expose a part of the first surface of the n+ type silicon carbide substrate;
    forming a first p type pillar region by first epitaxial growth on the exposed part of the first surface of the n+ type silicon carbide substrate;
    removing the buffer layer pattern, and then forming an n− type epitaxial layer by second epitaxial growth on the first p type pillar region and the first surface of the n+ type silicon carbide substrate;
    forming a p type epitaxial layer by third epitaxial growth on the n− type epitaxial layer;
    forming an n+ region by fourth epitaxial growth on the p type epitaxial layer; and
    forming a trench by penetrating the n+ region and the p type epitaxial layer and by etching a part of the n− type epitaxial layer, wherein the first p type pillar region is spaced apart from the trench, and the first p type pillar region is disposed in an area corresponding to a portion between two corners of the trench and in an area corresponding to the bottom of the trench.

3. The method of claim 2, further comprising:

after the forming of an n+ region, forming a gate insulating film within the trench;

forming a gate electrode on the gate insulating film;

forming an oxide film on the gate insulating film and the gate electrode; and forming a source electrode on the p type epitaxial layer, the n+ region, and the oxide film and forming a drain electrode on the second surface of the n+ type silicon carbide substrate.

* * * * *